United States Patent [19]

Allen et al.

[11] Patent Number: 5,283,160
[45] Date of Patent: Feb. 1, 1994

[54] POLYMERIZABLE COMPOSITIONS

[75] Inventors: N. S. Allen, Bolton; R. T. Cook, Chester; C. H. McLean, Cheshire; I. A. Weddell, Chester, all of England

[73] Assignee: Zeneca Limited, London, England

[21] Appl. No.: 973,992

[22] Filed: Nov. 10, 1992

[30] Foreign Application Priority Data

Nov. 11, 1991 [GB] United Kingdom ............... 9123914

[51] Int. Cl.$^5$ .................................................. G03C 1/68
[52] U.S. Cl. ...................................... 430/281; 430/283; 430/913; 522/27; 522/28; 522/24; 522/48
[58] Field of Search ................ 430/912, 281, 283; 522/27, 48, 28, 24

[56] References Cited

U.S. PATENT DOCUMENTS

| | | | |
|---|---|---|---|
| 3,046,127 | 7/1962 | Barney et al. | 522/48 |
| 3,827,957 | 8/1974 | McGinnis | 522/48 |
| 3,865,594 | 2/1975 | Gauss et al. | 522/48 |
| 4,450,279 | 5/1984 | Shirosaki et al. | 430/281 |
| 4,576,898 | 3/1986 | Hoffmann et al. | 430/281 |
| 4,590,145 | 5/1986 | Itoh et al. | 430/281 |
| 4,608,333 | 8/1986 | Ohbayashi et al. | 430/281 |
| 4,657,842 | 4/1987 | Einter et al. | 430/48 |
| 4,927,865 | 5/1990 | Dothaler et al. | 430/48 |

FOREIGN PATENT DOCUMENTS 3126433 1/1983 Fed. Rep. of Germany .
2180245 3/1987 United Kingdom .

*Primary Examiner*—Jack P. Brammer
*Attorney, Agent, or Firm*—Cushman, Darby & Cushman

[57] ABSTRACT

A photopolymerisable composition comprising a polymerisable olefinically unsaturated compound and a photoinitiator composition (a) a photoinitiator comprising an anthraquinone compound having in the 2-position a substituent of the formula:

$$-X\ COR^1$$

wherein $R^1$ represents an optionally substituted hydrocarbyl radical and X represents $$-O-,\quad -S-\quad \text{or}\quad -\underset{\underset{R^2}{|}}{N}-$$

wherein $R^2$ represents hydrogen or an optionally substituted hydrocarbyl radical, and (b) a hydrogen donor capable of reducing the photoinitiator when the latter is in an excited state.

12 Claims, No Drawings

POLYMERIZABLE COMPOSITIONS

This invention relates to polymerisable compositions and more particularly to photopolymerisable compositions comprising a polymerisable olefinically unsaturated compound and a photoinitiator.

The free radical polymerisation of olefinically unsaturated compounds is well known and one method of effecting polymerisation is to irradiate a polymerisable composition containing the polymerisable olefinic compound and a photoinitiator with electromagnetic radiation such as visible or ultraviolet light, the photoinitiator being a compound capable of generating free radicals when so irradiated.

One class of photoinitiators comprises aromatic ketones, for example benzophenone, benzil and certain quinones, which are generally used in conjunction with a hydrogen donor such as an amine from which the photoinitiator, when subjected to and excited by radiation, abstracts a hydrogen atom and so forms radicals. In this connection, reference may be made, for example, to United Kingdom Patent Specification No. 1408265.

It has now been found that extremely effective photoinitiator compositions comprise certain 2-substituted anthraquinones, preferably in combination with appropriate hydrogen donors, said compositions providing very rapid photopolymerisation of polymerisable olefinic compounds.

Thus, according to one aspect of the invention, there is provided a photopolymerisable composition comprising a polymerisable olefinically unsaturated compound and a photoinitiator composition comprising:

(a) a photoinitiator comprising an anthraquinone compound having in the 2-position a substituent of the formula:

wherein $R^1$ represents an optionally substituted hydrocarbyl radical and X represents

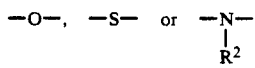

wherein $R^2$ represents hydrogen or an optionally substituted hydrocarbyl radical, and (b) a hydrogen donor capable of reducing the photoinitiator when the latter is in an excited state.

Optionally substituted hydrocarbyl radicals which may be represented by $R^1$ and $R^2$ in the anthraquinone compound include optionally substituted alkyl, optionally substituted aryl and optionally substituted alkenyl.

Substituents which may optionally be present on the hydrocarbyl radicals include halogen atoms such as chlorine. As examples of optionally substituted alkyl radicals which may be represented by $R^1$ and $R^2$, there may be mentioned optionally substituted $C_{1-4}$-alkyl, for example methyl, chloroethyl and isobutyl, and also optionally substituted higher alkyl radicals which may be linear or branched and which may contain up to 10 carbon atoms, for example hexyl and 2-ethylpentyl, or even larger numbers of carbon atoms, for example up to 20. As examples of optionally substituted aryl radicals which may be represented by $R^1$ and $R^2$, there may be mentioned optionally substituted phenyl and, as examples of optionally substituted alkenyl radicals, there may be mentioned optionally substituted vinyl and also optionally substituted higher alkenyl radicals containing up to 20 carbon atoms, for example heptadecenyl. The presence, as $R^1$ or $R^2$, of alkyl or alkenyl radicals having more than 4 carbon atoms can provide the anthraquinone compound with increased solubility in the polymerisable olefinically unsaturated compound and therefore permit higher concentrations of photoinitiator to be present in compositions of the invention. The positions of the anthraquinone nucleus other than the 2-position may be unsubstituted or substituted.

As examples of preferred anthraquinone compounds there may be mentioned, 2-acryloylaminoanthraquinone and 2-benzoylaminoanthraquinone.

If desired, the photoinitiator composition may contain a mixture of two or more of the 2-substituted anthraquinones or a mixture of one or more of the 2-substituted anthraquinones with one or more other photoinitiator materials.

Hydrogen donors which may be present in the photoinitiator composition include primary, secondary or tertiary amines in which at least one hydrogen atom is directly attached to a saturated carbon atom adjacent to the amino nitrogen. Suitable amines are well known in the art and include, for example, propylamine, diethylamine, triethylamine, benzyldimethylamine, N-phenylglycine, N, N-dimethylethanolamine, N-methyldiethanolamine, triethanolamine and, especially, dimethylaminoethyl methacrylate or ethyl p-dimethylaminobenzoate Mixtures of hydrogen donors, for example mixtures of amines, may be used.

The anthraquinone compound is suitably present in the compositions of the invention in an amount of from 0.01 to 5%, preferably from 0.05 to 2%, on a weight basis. The hydrogen donor may be present in an amount of from 0.01 to 5%, preferably from 0.5 to 1%, on a weight basis.

It may also be advantageous for the compositions of the invention to contain a peroxide such as benzoyl peroxide or a peroxyester such as tert-butyl perbenzoate. When such compounds are used, concentrations of from 0.01 to 5%, preferably from 0.5 to 1%, are appropriate.

The polymerisable olefinically unsaturated compound present in the composition of the invention will generally be a monomer, oligomer or polymer having at least one olefinically unsaturated double bond per molecule. Mixtures of two or more such compounds may be used if desired.

Suitable polymerisable olefinic monomers have been fully described in the prior art and include, for example, alpha-beta-unsaturated carboxylic acids, for example acrylic and methacrylic acids and the nitriles, amides and esters thereof, for example acrylonitrile, ethyl acrylate, methyl methacrylate, butyl methacrylate, glycidyl methacrylate, triethylene glycol dimethacrylate, ethoxylated bisphenol A dimethacrylate, acrylamide and methylene bis-acrylamide, vinyl aromatic compounds, for example styrene, alpha-methylstyrene and vinyltoluene, dienes, for example butadiene and isoprene, vinyl chloride, vinylidene chloride, vinyl carbazole, vinyl ketones and vinyl esters, for example vinyl acetate. Oligomers derived from these monomers may also be used. Olefinically unsaturated polymers which may be present in the compositions of the invention include unsaturated polyesters derived, for example, from unsaturated dicarboxylic acids.

The photopolymerisable compositions of the invention may be prepared by incorporating the photoinitiator composition into the polymerisable olefinically unsaturated compound or compounds in any convenient manner. Other conventional additives may also be incorporated if desired.

Photopolymerisation of the compositions of the invention may be effected by subjecting said compositions, preferably in the form of films, to radiation from sources which have emission maxima in the range from 200 to 500 nm and especially in the range 400 to 500 nm. Suitable radiation sources are known in the art and include actinic or superactinic fluorescent tubes, low pressure, medium pressure and high pressure mercury vapour lamps and xenon lamps as well as tungsten halogen and blue phosphor-fluorescent lamps.

Thus, according to a further aspect of the invention, there is provided a method for the preparation of a polymeric material which comprises irradiating a photopolymerisable composition of the invention with radiation having a wavelength which is capable of being absorbed by the photoinitiator so as to convert it to an excited state.

The compositions of the invention are useful in the production of light-curable adhesives, coatings, inks and the like.

The invention is illustrated but not limited by the following Examples.

EXAMPLES 1 TO 13

For the purpose of evaluation of cure speed, photoinitiator compositions were tested in a thin film preparation. Components a (the photoinitiator) and b (a tertiary amine) were dissolved in a thin film-forming methyl methacrylate oligomeric mixture in the amounts shown in Table 1. The resin mixture was cast in a thin layer onto "MELINEX" film. The coated "MELINEX" film was then laminated onto a supporting copper board at 94° C. The film was exposed to light (7 mw/cm$^2$) in the range 400–500 nm for 240 sec, the photospeed being determined by a Stauffer step wedge rating. The results for Examples 1–10 are shown in Table 1 together with the results for Comparative Examples I and 2. The a and b components used are identified by number below Table 1. For the purpose of illustrating cure depth, the components a, b and c (a peroxide) were dissolved in ethoxylated bisphenol A dimethacrylate resin in the amounts shown in Table 2. The resin mixture was poured into an open-ended mould of dimensions, height 12 mm, depth 4 mm and length 5 MM. The sample was irradiated from the top with light (200 mw/cm$^2$) in the region 400–500 nm for 60 seconds. The cure depth was determined by Vickers Hardness measurements taken at 1 mm intervals of increasing depth from the irradiated top surface. Once a value of 0.5 was obtained, the resin was deemed to be not polymerised. The results for Examples 11–13 are shown in Table 2 together with the results for Comparative Example 3.

The results show that anthraquinones containing groups of formula (1) in the 2-position have comparable and in some cases increased photospeed in comparison with known photoinitiators at very much lower concentrations. This gives the advantages of higher photospeed initiators at lower cost. The high photoactivity of these compounds lends itself to providing very good cure depth at low concentrations in comparison with one of the best currently available deep cure photoinitiators, camphorquinone.

TABLE 1

| Example No. | Component (a) (wt %) | Component (b) (wt %) | Step Wedge |
| --- | --- | --- | --- |
| 1 | (a)1 0.2 | (b)1 1.0 | 10 |
| 2 | (a)2 0.2 | (b)1 1.0 | 9 |
| 3 | (a)3 0.2 | (b)2 1.0 | 9 |
| 4 | (a)4 0.2 | (b)1 1.0 | 8 |
| 5 | (a)5 0.2 | (b)1 1.0 | 8 |
| 6 | (a)6 0.2 | (b)1 1.0 | 9 |
| 7 | (a)7 0.2 | (b)1 1.0 | 6 |
| 8 | (a)7 2.4 | (b)1 1.0 | 11 |
| 9 | (a)8 0.2 | (b)1 1.0 | 6 |
| 10 | (a)9 0.2 | (b)1 1.0 | 7 |
| Comparative Ex | | | |
| 1 | (a)10 1.0 | (b)2 1.0 | 9 |
| 2 | (a)11 0.2 | (b)2 1.0 | 5 |

(a)1 2-Benzoylaminoanthraquinone
(a)2 2-Acetylaminoanthraquinone
(a)3 2-Acryloylaminoanthraquinone
(a)4 2-(N-methylbenzoylamino)anthraquinone
(a)5 2-(2-Ethylhexanoylamino)anthraquinone
(a)6 2-Oleoylaminoanthraquinone
(a)7 2-(N-hexylacetylamino)anthraquinone
(a)8 2-(N-isobutylacetylamino)anthraquinone
(a)9 2-(N-methyl-3-chloropropionylamino)anthraquinone
(a)10 Camphorquinone
(a)11 Anthraquinone
(b)1 Ethyl dimethylaminobenzoate
(b)2 Dimethylaminoethyl methacrylate

TABLE 2

| Example No. | Component (a) (wt %) | Component (b) (wt %) | Component (c) (wt %) | Cure Depth (mm) |
| --- | --- | --- | --- | --- |
| 11 | (a)1 0.05 | (b)2 0.76 | (c)1 1.0 | 11.0 |
| 12 | (a)2 0.05 | (b)2 0.76 | (c)1 1.0 | 11.0 |
| 13 | (a)4 0.05 | (b)2 0.76 | (c)1 1.0 | 11.0 |
| Comparative Ex | | | | |
| 3 | (a)10 0.76 | (b)2 0.76 | (c)1 1.0 | 11.0 |

The a and b components specified in Table 2 are identified by number in relation to Table 1. Component (c)1 is t-butylperbenzoate.

We claim:

1. A photopolymerisable composition comprising a polymerisable olefinically unsaturated compound and a photoinitiator composition comprising:

(a) a photoinitiator comprising an anthraquinone compound having in the 2-position a substituent of the formula:

$$-X \text{ COR}^1 \qquad (1)$$

wherein $R^1$ represents an optionally substituted hydrocarbyl radical and X represents

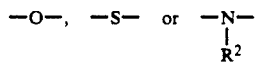

wherein $R^2$ represents hydrogen or an optionally substituted hydrocarbyl radical, and (b) a hydrogen donor capable of reducing the photoinitiator when the latter is in an excited state.

2. A composition according to claim 1 wherein $R^1$ is an optionally substituted alkyl, aryl or alkenyl radical.

3. A composition according to claim 2 wherein $R^1$ is an optionally substituted alkyl radical containing up to 10 carbon atoms.

4. A composition according to claim 3 wherein $R^1$ is an optionally substituted alkyl radical containing up to 4 carbon atoms.

5. A composition according to claim 2 wherein $R^1$ is an optionally substituted phenyl radical.

6. A composition according to claim 2 wherein $R^1$ is an optionally substituted alkenyl radical containing up to 20 carbon atoms.

7. A composition according to claim 6 wherein $R^1$ is an optionally substituted vinyl radical.

8. A composition according to any one of claims 1 to 7 wherein $R^2$ is an optionally substituted alkyl, aryl or alkenyl radical.

9. A composition according to claim 8 wherein $R^2$ is an optionally substituted alkyl radical containing up to 10 carbon atoms.

10. A composition according to claim 9 wherein $R^2$ is an optionally substituted alkyl radical containing up to 4 carbon atoms.

11. A composition according to any one of claims 1 to 10 wherein the hydrogen donor is a primary, secondary or tertiary amine in which at least one hydrogen atom is directly attached to a saturated carbon atom adjacent to the amino nitrogen.

12. A composition according to any one of claims 1 to 11 which also contains a peroxide or a peroxyester.

* * * * *